(12) United States Patent
Nguyen et al.

(10) Patent No.: US 10,304,530 B2
(45) Date of Patent: May 28, 2019

(54) PER-PIN COMPACT REFERENCE VOLTAGE GENERATOR

(71) Applicant: Apple Inc., Cupertino, CA (US)

(72) Inventors: Huy M. Nguyen, San Jose, CA (US); Seong Hoon Lee, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/684,594

(22) Filed: Aug. 23, 2017

(65) Prior Publication Data

US 2019/0066777 A1    Feb. 28, 2019

(51) Int. Cl.
*G11C 13/00*      (2006.01)
*H03K 3/012*      (2006.01)

(52) U.S. Cl.
CPC .......... *G11C 13/004* (2013.01); *H03K 3/012* (2013.01); *G11C 2013/0054* (2013.01)

(58) Field of Classification Search
CPC .............................. G11C 13/004; H03K 3/012
See application file for complete search history.

(56) References Cited

U.S. PATENT DOCUMENTS

| | | | |
|---|---|---|---|
| 6,204,791 B1 | 3/2001 | Yamamoto et al. | |
| 6,600,439 B1 | 7/2003 | Pahr | |
| 8,305,370 B2 * | 11/2012 | Song | G09G 3/3225 345/207 |
| 9,106,183 B2 * | 8/2015 | Liu | H02M 3/07 |
| 9,437,273 B2 * | 9/2016 | Yamazaki | G11C 11/405 |
| 9,654,136 B1 | 5/2017 | Deak | |
| 2007/0109173 A1 | 5/2007 | Mulder | |
| 2012/0249114 A1 * | 10/2012 | Sako | G05F 1/561 323/312 |
| 2016/0320783 A1 * | 11/2016 | Yoshii | G05F 1/575 |
| 2018/0152656 A1 * | 5/2018 | Matsumoto | H03M 1/46 |

* cited by examiner

*Primary Examiner* — Tri M Hoang
(74) *Attorney, Agent, or Firm* — Meyertons Hood Kivlin Kowert and Goetzel PC; Rory D. Rankin

(57) ABSTRACT

Systems, apparatuses, and methods for generating a reference voltage are described. In various embodiments, an interface between a memory and a processor uses a reference voltage generator to generate a reference voltage for a single pin or a small group of pins. The generator generates a default reference voltage from a first tap in a resistor ladder, injects current with a current controller into a second tap of the resistor ladder when the generator receives an indication to generate a larger reference voltage, and draws current from a third tap of the resistor ladder when the generator receives an indication to generate a smaller reference voltage. The generator also generates a high threshold voltage independent of a low threshold voltage after calibration.

20 Claims, 5 Drawing Sheets

PER-PIN COMPACT REFERENCE VOLTAGE GENERATOR

BACKGROUND

Technical Field

Embodiments described herein relate to the field of integrated circuits and, more particularly, to generating a reference voltage.

Description of the Related Art

Lower-level memory in a computing system provides relatively inexpensive and relatively large data storage capacity, especially compared to on-chip caches. However, off-chip dynamic random access memory (DRAM) used as lower-level memory have appreciable access times when data access requests are serviced. Therefore, system performance is affected. One approach to improving performance involves using one or more caches in a hierarchical memory subsystem to reduce data access latencies.

While using caches can improve performance, various issues reduce the effectiveness of cache performance. For example, conflict, or collision, misses occur within a set-associative or a direct-mapped cache when too many blocks map to a same set. The misses cause one or more blocks to be discarded within that set. As a consequence, the average memory latency for a given source in the system may be degraded due to the misses. The cache misses cause accesses to lower-level memory, such as the DRAM, to retrieve the requested data in addition to evicting data to create storage for the retrieved data.

Voltage droop is one cause of relatively slow DRAM access times. For example, when a memory cell is accessed, a corresponding row line and/or a column line is pulled up and a drop in the supply voltage occurs which may range from a few hundred millivolts to a one volt. Consequently, a stable output becomes problematic and each pin of a channel between the DRAM and a processing unit has its own voltage offset. Therefore, each of a logic high value and a logic low value is detected at different voltage levels among the pins. Designers wish to increase the speed of the DRAM accesses even in mixed voltage systems. At the same time, designers wish to use a compact solution that does not consume appreciable on-die area. Further, designers wish to have a low-power solution which would not quickly consume the battery life of mobile devices.

In view of the above, methods and mechanisms for generating a reference voltage are desired.

SUMMARY

Systems and methods for generating a reference voltage are contemplated. In various embodiments, a computing system uses a memory and a processor, which generates access requests for data stored in the memory. Each of the memory and the processor uses an interface for transferring data and control signals between one another. The interfaces use a reference voltage generator for generating a reference voltage used to determine whether a received bit is a logic high value or a logic low value. In some embodiments, each pin in the interface uses a respective reference voltage generator. In other embodiments, a group of pins, such as two or four pins, uses a respective reference voltage generator. However, in various embodiments, the reference voltage generator is not used by an entire channel.

The reference voltage generator generates a default reference voltage from a first tap within a resistor ladder. In an embodiment, the generator uses the first tap for generating any default reference voltage, and thus, does not select from the multiple taps in the resistor ladder for other default reference voltages. In some embodiments, the generator injects current with a current controller into a second tap of the resistor ladder when the generator receives an indication to generate a reference voltage greater than the default reference voltage. Similarly, the generator draws current with the current controller from a third tap of the resistor ladder when the generator receives an indication to generate a reference voltage less than the default reference voltage. In an embodiment, the current controller in the generator is a current digital to analog converter coupled to a current mirror. In various embodiments, each of the first tap, the second tap and the third tap is a separate tap from one another in the resistor ladder.

In an embodiment, calibration circuitry on one or more of the memory and the processor calibrates the receiver logic including the reference voltage generator. Upon concluding the calibration step, the calibration circuitry sends control signals to the current controller for injecting or drawing any current. Therefore, the current value of the default reference voltage changes based on the calibration step. The adjustment of the reference voltage occurs for a small subset of pins, since the reference voltage generator is connected to a relatively small number of pins. In one example, the generator is connected to a single pin.

In addition, the reference voltage generator includes a high threshold generator and a low threshold generator. The high threshold generator generates a logic high reference voltage used for determining whether a received bit is a logic high value. The low threshold generator generates a logic low reference voltage used for determining whether a received bit is a logic low value. Therefore, in various embodiments, the reference voltage generator does not use a single threshold reference voltage.

The calibration circuitry further provides a logic high offset and a logic low offset different from the logic high offset. The high threshold generator selects a given tap in the resistor ladder of the generator based on the received logic high offset. In some embodiments, the high threshold generator is one or more pass gates with gate terminals receiving the logic high offset from the external calibration circuitry. The voltage generated at the selected given tap in the resistor ladder is connected to an output of the reference voltage generator through the pass gate. The low threshold generator provides similar functionality. Therefore, the reference voltage generator generates the logic high reference voltage and the logic low reference voltage independent of one another.

In an embodiment, the reference voltage generator uses a transistor between a power supply and the resistor ladder. A gate terminal of the transistor receives an enable signal for the reference voltage generator. Therefore, an amount of time to turn on and off the reference voltage generator is relatively short and does not rely on a settling time of an operational amplifier as one is not used.

These and other embodiments will be further appreciated upon reference to the following description and drawings.

BRIEF DESCRIPTION OF THE DRAWINGS

The above and further advantages of the methods and mechanisms may be better understood by referring to the following description in conjunction with the accompanying drawings, in which.

Figure 1:
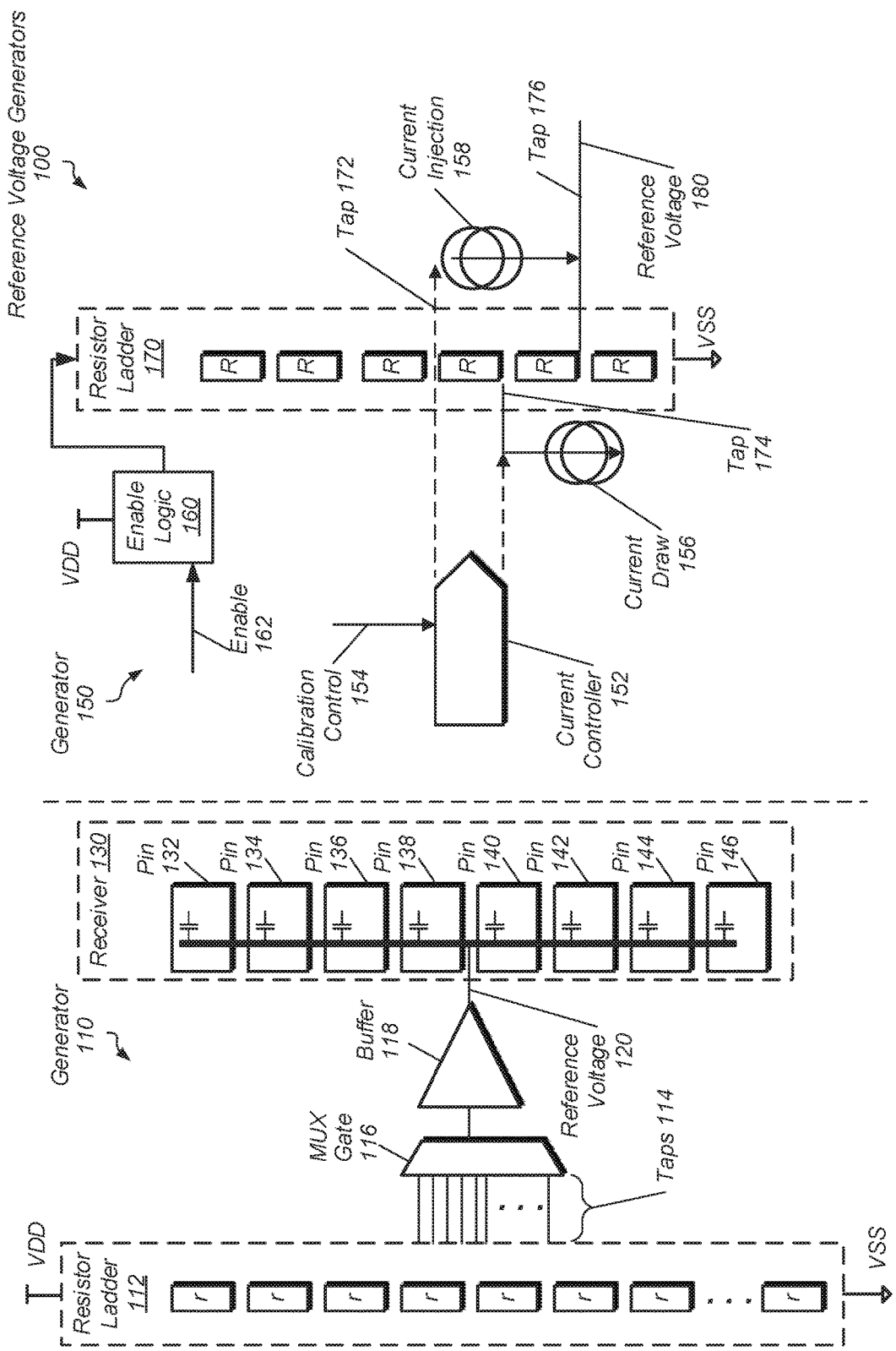
FIG. 1 is a block diagram of multiple embodiments of reference voltage generators.

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) for that unit/circuit/component.

DETAILED DESCRIPTION OF EMBODIMENTS

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

Referring to FIG. 1, a block diagram illustrating multiple embodiments of reference voltage generators 100 is shown. Both a reference voltage generator 110 and a reference voltage generator 150 are shown. Each of the reference voltage generators 110 and 150, which are also referred to as generators 110 and 150, use respective resistor ladders 112 and 170 as voltage dividers. The resistor ladder 112 in the generator 110 includes multiple resistive elements indicated by the blocks with an "r". Each of the resistive elements is separated from another by a node which is referred to as a "tap." One or more of the taps 114 are provided as outputs to the complex gate 116. In the illustrated embodiment, the complex gate 116 is a multiplexer (mux) gate. The resistor ladder 112 receives a power supply voltage, which sources current through the resistive elements to the ground node at the bottom of the resistor ladder 112. Each of the taps 114 provides a different output voltage. The power supply is shown as "VDD" and the ground node is shown as "VSS."

The mux gate 116 receives a signal from control logic (not shown) for selecting one of the multiple taps 114 and sending the corresponding output voltage value to the buffer 118. In some embodiments, the buffer 118 is an operational amplifier. The buffer 118 sends a reference voltage 120 to the receiver 130. As shown, the receiver 130 includes pins 132-146. In some embodiments, the receiver 130 is part of a channel between a processor and a DRAM. Although eight pins are shown in the illustrated embodiment, in other embodiments, any number of pins are connected to the reference voltage 120.

In the illustrated embodiment, each of the pins 132-146 has an associated capacitance shown as a simple capacitor. As each individual capacitance increases, the noise immunity increases. However, the amount of time to change the reference voltage 120 also increases as the amount of charge on the node to charge or discharge also increases. Calibration of the generator 110 occurs periodically after a given time period. Calibration is also referred to as training. In various embodiments, after a given time interval has elapsed, calibration occurs by reading data from a source and sweeping the reference voltage value. In some embodiments, the source is a memory and the generator 110 is on a processor. In other embodiments, the source is the processor and the generator 110 is on the memory.

Calibration circuitry determines a new reference voltage to be used when receiving data and determining whether received data is a logic high value or a logic low value. The calibration circuitry sends control signals to the mux gate 116 to select a different tap among the taps 114. When the capacitance on the node for the reference voltage 120 increases, such as the number of pins increase, the amount of time to change the reference voltage 120 also increases. Additionally, the amount of time to turn on and off the generator 110 is dependent upon the settling time of the buffer 118, which, in various embodiments, is an operational amplifier.

Turning now to the generator 150, in various embodiments, the resistor ladder 170 has fewer and more coarse resistive elements than the resistor ladder 112. The resistive elements are shown as blocks with an "R" in the resistor ladder 170. As shown, the power supply is provided to the resistor ladder 170 through enable logic 160. An enable signal 162 allows the power supply value to be applied to the resistor ladder 170. In an embodiment, the generator 150 uses a transistor between the power supply and the resistor ladder 170. A gate terminal of the transistor receives the enable signal 162. Therefore, an amount of time to turn on and off the generator 150 is relatively quick and does not rely on a settling time of an operational amplifier as one is not used.

In contrast to the generator 110, the generator 150 is shown to use a single tap 176 for providing an output reference voltage 180. In other embodiments, a multiplexer gate or other selective circuitry is used to select among the multiple taps within the resistor ladder 170. In the illustrated embodiment, a current controller 152 is used to either perform current injection 158 into the tap 172 of the resistor ladder 170 or perform current draw 156 from the tap 174 of the resistor ladder 170. The current injection 158 or the current draw 156 determines the value of the reference voltage 180 on the output tap 176. In an embodiment, the current controller 152 is a current digital to analog converter (iDAC) coupled to a current mirror. In one embodiment, the iDAC receives calibration control signals 154 from external calibration circuitry. The external calibration circuitry determines whether current is drawn from the resistor ladder or injected into the resistor ladder, and what amount of current.

In various embodiments, the reference voltage 180 is provided to a single pin on a receiver. In other embodiments, the reference voltage 180 is provided to multiple pins, but the number of pins is appreciably small. For example, the number may be two, four or as high as eight for a byte of data, but the multiple pins are not four or eight bytes of a channel between a processor and a memory such as a DRAM. Therefore, the load capacitance on the tap 176 is relatively small, which allows for relatively quick calibration (training) and less power consumption. The noise immunity for the generator 150 is relatively high, since the reference voltage 180 is provided to a relatively small number of pins. Power consumption is further reduced as well as the turn on/off time is reduced as the generator 150 does not use an operational amplifier. The current controller 152 is appreciably faster and consumes less power than an operational amplifier. The generator 150 is also capable of providing independent high threshold reference voltage and low threshold reference voltage with additions of threshold generators. A further description of the threshold generators is provided next.

Figure 2:
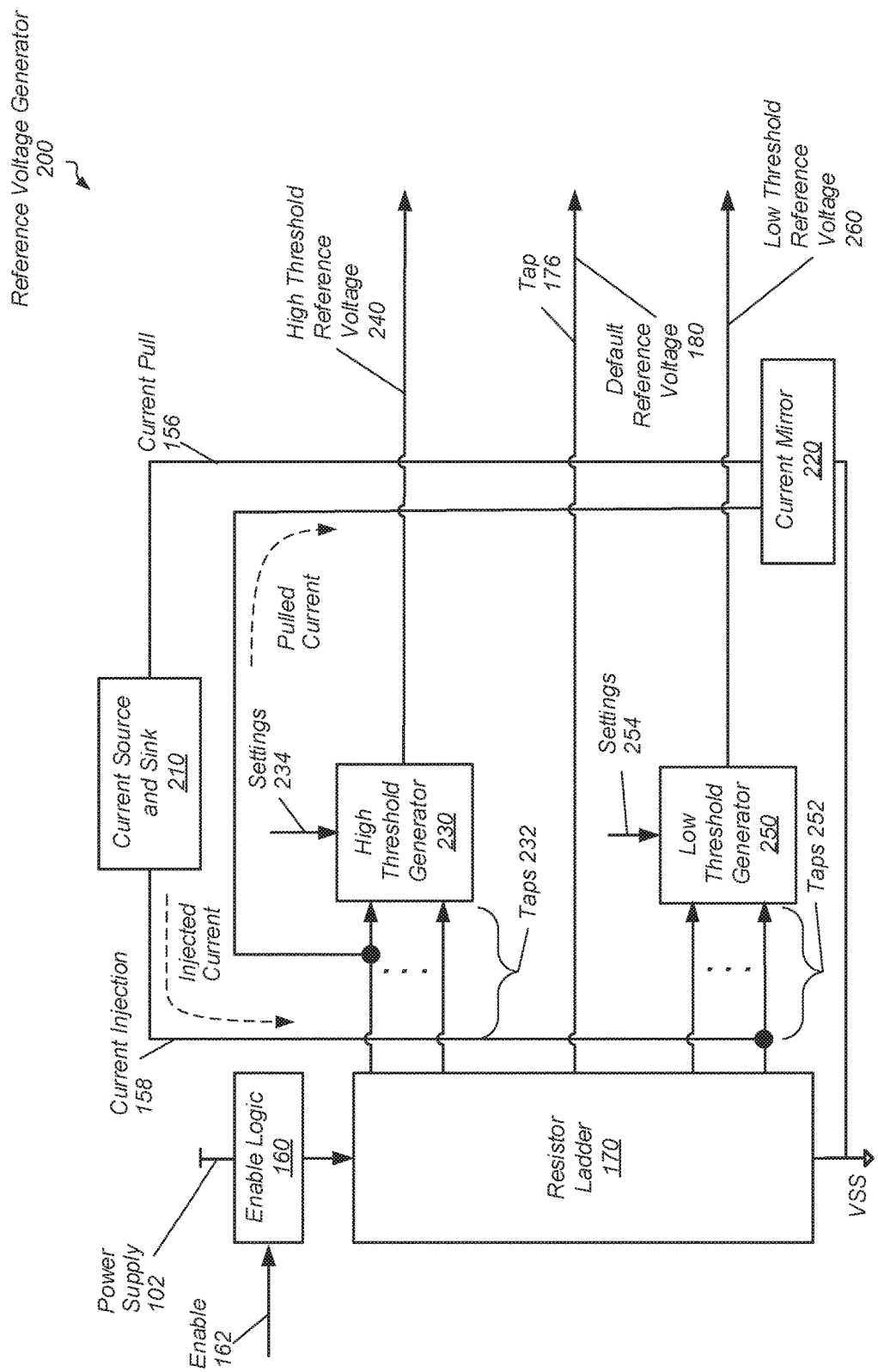
FIG. 2 is a block diagram of another embodiment of a reference voltage generator.

Turning now to FIG. 2, a block diagram illustrating another embodiment of a reference voltage generator 200 is shown. Control logic and circuitry already described are numbered identically. The reference voltage generator 200 includes threshold generators 230 and 250 for generating the high threshold reference voltage 240 and the low threshold reference voltage 260, respectively. As described earlier, the external calibration circuitry recalibrates the reference voltage generator 200 after a given time interval elapses. In some embodiments, the calibration circuitry determines a new default reference voltage 180 to be provided by the generator 200 on the tap 176. For example, the current source and sink 210 receives calibration control signals (not shown) for determining an amount of current to inject into a tap in the resistor ladder 170 or draw current from a tap in the resistor ladder 170. In various embodiments, the current injection and the current draw are performed on different taps within the resistor ladder 170. The current mirror 220 is used in combination with the current source and sink 210 to draw current from the resistor ladder 170. The amount of current injected or drawn resets the reference voltage 180 on the tap 176.

In other embodiments, rather than determine a single value, the external calibration circuitry determines a logic high offset and a logic low offset. In various embodiments, the logic low offset is different from the logic high offset. The logic high offset is a voltage offset from a midpoint voltage used to determine the next logic low threshold voltage. The logic low threshold voltage is used to determine a received signal is a logic high value. In a similar manner, the logic low offset is a voltage offset from a midpoint voltage used to determine the next logic high threshold voltage. The logic high threshold voltage is used to determine a received signal is a logic low value. Therefore, two values are determined by the external calibration circuitry.

Indications of the two values determined by the external calibration circuitry are provided to each of the current source and sink 210 and the threshold generators 230 and 250. As shown, the high threshold generator 230 receives the settings 234 and the low threshold generator 250 receives the settings 254. The logic high threshold voltage 240 is generated by selecting a tap from the taps 232 in the resistor ladder 170. In various embodiments, the settings 234 turns on a pass gate of multiple pass gates within the high threshold generator 230. The pass gates have gate terminals receiving the settings 234 from the external calibration circuitry. In some embodiments, only a single pass gate of the multiple pass gates in the high threshold generator 230 is turned on. The voltage generated at the selected tap of the multiple taps 232 in the resistor ladder 170 is connected to an output of the reference voltage generator 200 through the enabled pass gate.

In a similar manner as the above description, the logic low threshold voltage 260 is generated by selecting a tap from the multiple taps 252 in the resistor ladder 170. In various embodiments, the settings 254 turns on a pass gate of multiple pass gates within the low threshold generator 250. The pass gates have gate terminals receiving the settings 254. The voltage generated at the selected tap of the multiple taps 252 in the resistor ladder 170 is connected to an output of the reference voltage generator 200 through the enabled pass gate. Additional pass gates (not shown) are used to select which of the output voltages 180, 240 and 260 are provided by the generator 200. In some embodiments, the generator 200 continually provides two output voltages. However, when each of the logic high offset and the logic low offset is zero, the default reference voltage 180 is provided on both of the two output voltage pins, rather than providing the two separate values of the high threshold reference voltage 240 and the low threshold reference voltage 260.

As described earlier, the power supply is provided to the resistor ladder 170 through enable logic 160. An amount of time to turn on and off the generator 200 is relatively quick and does not rely on a settling time of an operational amplifier as one is not used. In some embodiments, the current source and sink 210 is a current digital to analog converter (iDAC) which is coupled to the current mirror 220. Turning on and off the current source and sink 210 is relatively faster than turning on and off an operational amplifier as well as the current source and sink 210 consumes less power.

In various embodiments, the reference voltage 180 is provided to a single pin on a receiver. In other embodiments, the reference voltage 180 is provided to multiple pins, but the number of pins is appreciably small. For example, the number may be two, four or as high as eight for a byte of data, but the multiple pins are not four or eight bytes of a channel between a processor and a memory such as a DRAM. Therefore, the load capacitance on the tap 176 is relatively small, which allows for relatively quick calibration (training) and less power consumption. The noise immunity for the generator 200 is relatively high, since the reference voltage 180 is provided to a relatively small number of pins. The generator 200 also performs per pin offset cancellation on each of a logic high basis and a logic low basis through the use of the threshold generators 230 and 250. In some embodiments, the generator 200 is used in one of two modes. A first mode provides a per byte calibration of the default reference voltage, whereas the logic high and logic low offset cancellations are performed on a per pin basis. A second mode provides a per pin calibration of the default reference voltage and additionally provides the logic high and the logic low offset cancellations on a per pin basis. Other types of modes and combinations of the number of pins used for the calibration of the default reference voltage and the logic high and the logic low offset cancellations are possible and contemplated.

Figure 3:
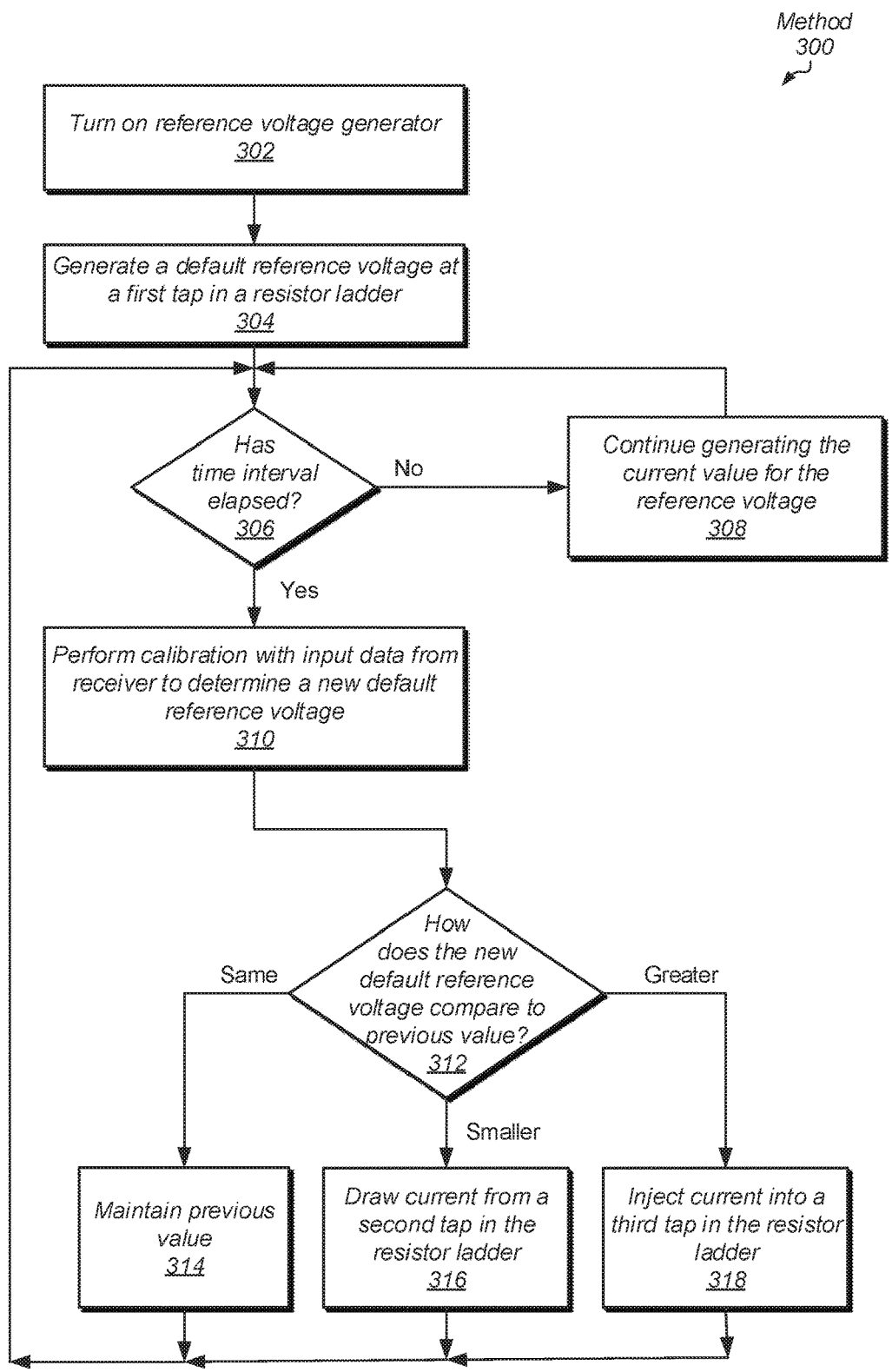
FIG. 3 is a flow diagram of one embodiment of a method for generating a reference voltage.

Referring now to FIG. 3, a generalized flow diagram of one embodiment of a method 300 for generating a reference voltage is shown. For purposes of discussion, the steps in this embodiment (as well as for FIG. 4) are shown in sequential order. However, in other embodiments some steps may occur in a different order than shown, some steps may be performed concurrently, some steps may be combined with other steps, and some steps may be absent.

Upon startup, a reference voltage generator is turned on (block 302). In an embodiment, the reference voltage generator uses a transistor between a power supply and a resistor ladder. A gate terminal of the transistor receives an enable signal for the reference voltage generator. Therefore, an amount of time to turn on and off the reference voltage generator is relatively quick and does not rely on a settling time of an operational amplifier as one is not used. In some embodiments, the reference voltage generator is used in an interface on a memory. In other embodiments, the reference voltage generator is used in an interface on a processor generating access requests for data stored in the memory.

A default reference voltage is generated at a first tap in the resistor ladder (block 304). In an embodiment, the generator uses the first tap for generating any default reference voltage, and thus, does not select from the multiple taps in the resistor ladder for other default reference voltages. If a given time interval has not elapsed ("no" branch of the conditional block 306), then the generator continues to generate the current value for the reference voltage (block 308). If a given time interval has elapsed ("yes" branch of the conditional block 306), then calibration is performed with input data from a receiver to determine a new default reference voltage (block 310). The reference voltage generator is connected to a relatively small number of pins. In one example, the generator is connected to a single pin. Therefore, the load capacitance of the reference voltage generator on a per pin basis is relatively small, which increases the speed of calibration. Calibration is also referred to as training.

If the new default reference voltage is the same as the previous value ("same" branch of the conditional block 312), then the previous value is maintained (block 314). If the new default reference voltage is smaller than the previous value ("smaller" branch of the conditional block 312), then current is drawn from a second tap in the resistor ladder (block 316), which reduces the default reference voltage at the first tap in the resistor ladder. If the new default reference voltage is greater than the previous value ("greater" branch of the conditional block 312), then current is injected into a third tap in the resistor ladder (block 318), which increases the default reference voltage at the first tap in the resistor ladder. In some embodiments, the second tap and the third tap are different taps in the resistor ladder. In various embodiments, each of the second tap and the third tap is a different tap from the first tap in the resistor ladder used for the default reference voltage.

In some embodiments, the generator injects current and draws current with a current controller. In an embodiment, the current controller in the generator is a current digital to analog converter (iDAC) coupled to a current mirror. In one embodiment, the iDAC receives control signals from calibration circuitry, which determines whether current is drawn from the resistor ladder or injected into the resistor ladder, and what amount of current. After the default reference voltage is maintained or changed, control flow of method 300 returns to conditional block 306 where it is determined whether the given time interval for another calibration has elapsed.

Figure 4:
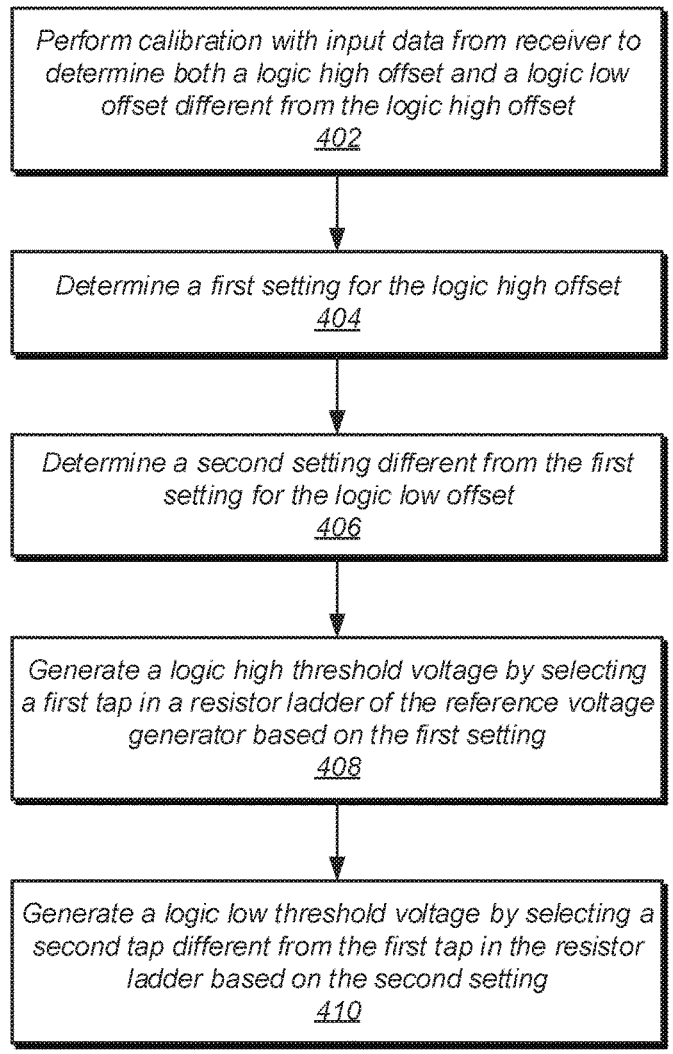
FIG. 4 is a flow diagram of one embodiment of a method for generating threshold reference voltages.

Turning now to FIG. 4, a generalized flow diagram of one embodiment of a method 400 for generating threshold reference voltages is shown. Calibration is performed with input data from a receiver to determine both a logic high offset and a logic low offset (block 402). In various embodiments, the logic low offset is different from the logic high offset. Calibration is also referred to as training. As described earlier, the logic high offset is a voltage offset from a midpoint voltage used to determine the next logic low threshold voltage. The logic low threshold voltage is used to determine a received signal is a logic high value. In a similar manner, the logic low offset is a voltage offset from a midpoint voltage used to determine the next logic high threshold voltage. The logic high threshold voltage is used to determine a received signal is a logic low value.

In various embodiments, after a given time interval has elapsed, calibration occurs by reading data from a source and sweeping the reference voltage value. In some embodiments, the source is a memory. The reference voltage generator is connected to a relatively small number of pins. In one embodiment, the generator is connected to a single pin. Therefore, the load capacitance of the reference voltage generator on a per pin basis is relatively small, which increases the speed of calibration. A first setting is determined as an indication for the logic high offset (block 404). Similarly, a second setting different from the first setting is determined as an indication for the logic low offset (block 406).

A logic high threshold voltage is generated by selecting a first tap in a resistor ladder of the reference voltage generator based on the first setting (block 408). In various embodiments, the first setting turns on a pass gate of multiple pass gates. The pass gates have gate terminals receiving the logic high offset from the external calibration circuitry. In some embodiments, only a single pass gate of the multiple pass gates is turned on. The voltage generated at the selected first tap in the resistor ladder is connected to an output of the reference voltage generator through the enabled pass gate. In a similar manner, a logic low threshold voltage is generated by selecting a second tap different from the first tap in the resistor ladder based on the second setting (block 410).

In various embodiments, the second setting turns on a pass gate of multiple pass gates different from the multiple pass gates used for the logic high threshold voltage. The pass gates have gate terminals receiving the logic low offset from the external calibration circuitry. In some embodiments, only a single pass gate of the multiple pass gates is turned on. The voltage generated at the selected second tap in the resistor ladder is connected to an output of the reference voltage generator through the enabled pass gate. Therefore, the reference voltage generator independently generates two reference voltages.

Figure 5:
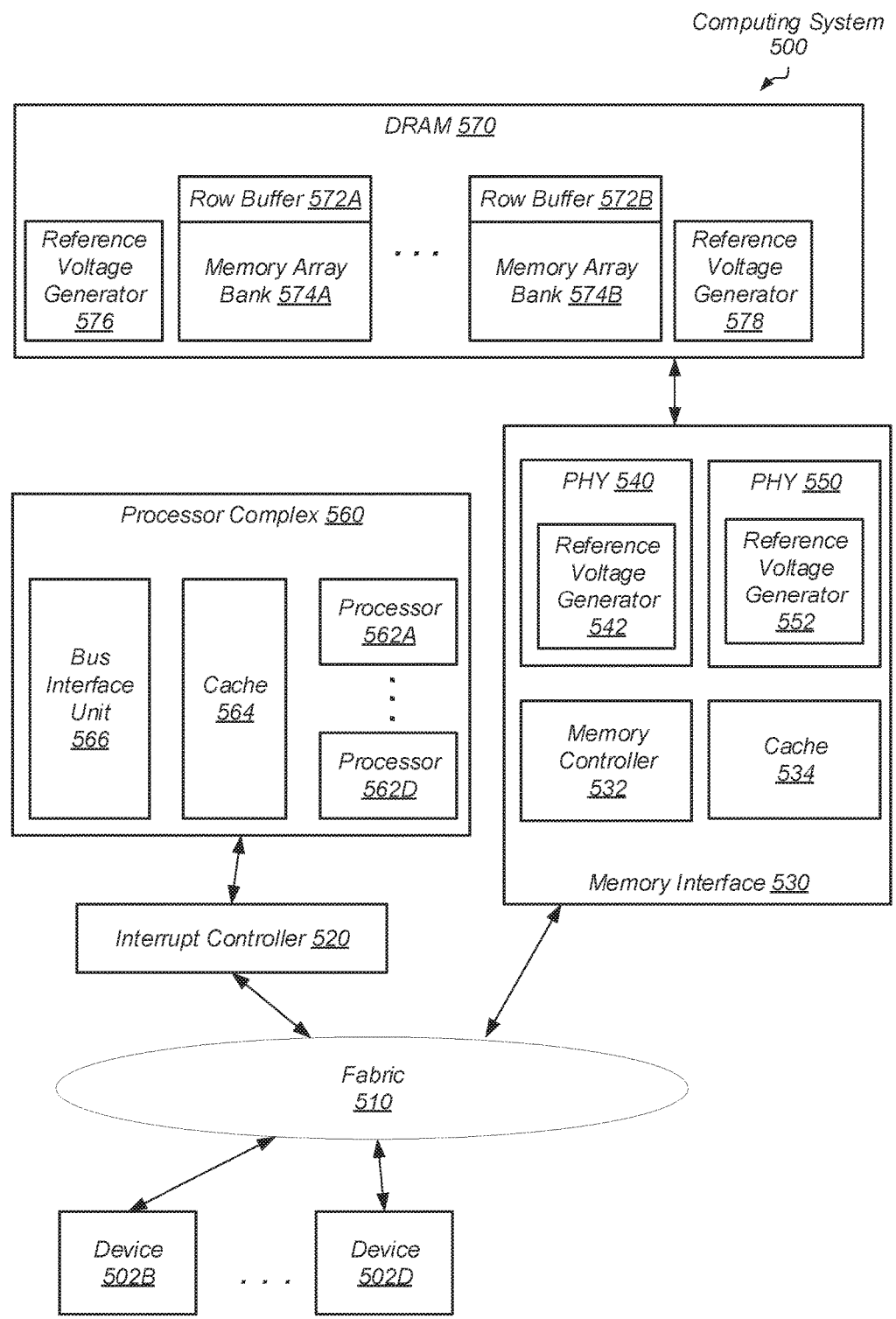
FIG. 5 is a block diagram of another embodiment of computing system.

Turning now to FIG. 5, a generalized block diagram of one embodiment of a computing system 500 capable of independently generating multiple reference voltages on a per pin basis is shown. As shown, a communication fabric 510 routes traffic between the devices 502A-502D and each of the memory interface 530 and the processor complex 550. In the illustrated embodiment, each of the memory interface 530 and the dynamic random access memory (DRAM) 570 use reference voltage generators. In other embodiments, one or more of the processor complex 560 and the devices 502A-502D also use reference voltage generators.

In various embodiments, the computing system 500 is a system on a chip (SOC) that includes multiple types of integrated circuits on a single semiconductor die, each integrated circuit providing a separate functionality. In other embodiments, the multiple functional units are individual dies within a package, such as a multi-chip module (MCM). In yet other embodiments, the multiple functional units are individual dies or chips on a printed circuit board. Clock sources, such as phase lock loops (PLLs), various input/output (I/O) interfaces, and a centralized control block for at least power management are not shown for ease of illustration.

One or more of the number of the devices 502A-502D are on-chip devices. In addition, one or more of the devices 502A-502D are on-chip functional units. Alternatively, one or more of the devices 502A-502D are any variety of computer peripheral devices or other off-chip devices. Examples of the devices 502A-502D are audio, video, camera, and telephony controllers as well as various analog, digital, mixed-signal and radio-frequency (RF) functional units, and so on.

In various embodiments, one or more of the fabric 510 and interfaces within the devices 502A-502D use queues and control logic for determining an order between the read and write transactions of a corresponding one of the devices 502A-502D and additionally convert requests and responses as they go back and forth over different types of communication protocols.

In various embodiments, different types of traffic flows independently through the fabric 510. The independent flow is accomplished by allowing a single physical fabric bus to include a number of overlaying virtual channels, or dedicated source and destination buffers, each carrying a different type of traffic. Each channel is independently flow controlled with no dependence between transactions in different channels.

The interrupt controller 520 receives and routes interrupts from the multiple components within and connected to the computing system 500. In various embodiments, the interrupt controller 520 uses circuitry in the fabric to ensure coherence among the different processors 562A-562D and the devices 502A-502D. In some embodiments, this circuitry uses cache coherency logic employing a cache coherency protocol to ensure data accessed by each source is kept up to date.

Processor complex 560 uses a bus interface unit (BIU) 566 for providing memory access requests and responses to at least the processors 562A-562D. Processor complex 560 also supports a cache memory subsystem which includes at least cache 564. In some embodiments, the cache 552 is a shared off-die level two (L2) cache for the processors 562A-562D. Processor complex 560 also uses an interface (not shown) for communication with the fabric 510.

In some embodiments, the processors 562A-562D use a homogeneous architecture. For example, each of the processors 562A-562D is a general-purpose processor, such as central processing unit (CPU), which utilizes circuitry for executing instructions according to a predefined general-purpose instruction set. In some embodiments, each core within a CPU supports the out-of-order execution of one or more threads of a software process and include a multi-stage pipeline.

In other embodiments, the processors 562A-562D use a heterogeneous architecture. In such embodiments, one or more of the processors 562A-562D is a highly parallel data architected processor. In some embodiments, these other processors of the processors 562A-562D use single instruction multiple data (SIMD) cores. Examples of SIMD cores are graphics processing units (GPUs), digital signal processing (DSP) cores, or otherwise.

The memory interface 530 uses at least one memory controller 532 and at least one cache 534 for the off-chip memory, such as synchronous DRAM (SDRAM) 570. The memory interface 530 stores memory requests in request queues, uses any number of memory ports, and uses circuitry configured to interface to memory using one or more of a variety of protocols used to interface with memory channels. The memory physical interface circuits (PHYs) 540 and 550 are representative of any number of memory PHYs capable of being coupled to the memory interface 530. Memory PHYs 540 and 550 are used to interface to memory devices of the DRAM 570. Memory PHYs 540 and 550 handle the low-level physical interface to the memory devices. For example, the memory PHYs 540 and 550 may be responsible for the timing of the signals, for proper clocking to synchronous DRAM memory, etc.

If a cache miss occurs, such as a requested block is not found in an on-chip cache memory subsystem, then a read request is generated and transmitted to the memory controller 532. The memory controller 532 translates an address corresponding to the requested block and sends a read request to the off-chip DRAM 570. The off-chip DRAM 570 is filled with data from an off-chip disk memory, solid-state memory or other. In some embodiments, the off-chip DRAM 570 is a type of dynamic random-access memory that stores each bit of data in a separate capacitor within an integrated circuit in a volatile manner. In an embodiment, the off-chip DRAM 570 includes a multi-channel memory architecture. This type of architecture increases the transfer speed of data to the memory controller 532 by adding more channels of communication between them. The multi-channel architecture utilizes multiple memory modules and a motherboard and/or a card capable of supporting multiple channels.

In one embodiment, each of the memory modules has a same protocol for a respective interface to the memory controller 532. One example of a protocol is a double data rate (DDR) type of protocol. The protocol may determine values used for information transfer, such as a number of data transfers per clock cycle, signal voltage levels, signal timings, signal and clock phases and clock frequencies. Protocol examples include DDR2 SDRAM, DDR3 SDRAM, GDDR4 (Graphics Double Data Rate, version 4) SDRAM, LPDDR4x (Low Power Double Data Rate), LPDDR5x and GDDR5 (Graphics Double Data Rate, version 5) SDRAM.

In some embodiments, the DRAM 570 uses a topology which includes multiple memory array banks 574A-574B. As shown, each one of the banks 574A-574B includes a respective one of the row buffers 572A-572B. Each one of the row buffers 572A-572B stores data in an accessed row of the multiple rows within the memory array banks 574A-574B. The accessed row may be identified by a DRAM address in the received memory request. Control logic (not shown) may perform tag comparisons between a cache tag in a received memory request and the one or more cache tags stored in the row buffer.

As shown, the memory controller 532 uses reference voltage generators 542 and 552. Additionally, the DRAM 570 uses reference voltage generators 576 and 578. These reference voltage generators are used when data is transferred between on-chip components and the off-chip DRAM 570. In various embodiments, these reference voltage generators use a topology as described earlier for the reference voltage generator 200 and perform steps as described earlier for methods 300 and 400. Therefore, each one of these reference voltage generators independently generate a logic high reference voltage and a logic low reference voltage with a relatively high startup, perform training in a relatively quick manner and provide relatively high noise immunity.

In various embodiments, program instructions of a software application may be used to implement the methods and/or mechanisms previously described. The program instructions may describe the behavior of hardware in a high-level programming language, such as C. Alternatively, a hardware design language (HDL) may be used, such as Verilog. The program instructions may be stored on a non-transitory computer readable storage medium. Numerous types of storage media are available. The storage medium may be accessible by a computer during use to provide the program instructions and accompanying data to the computer for program execution. In some embodiments, a synthesis tool reads the program instructions in order to produce a netlist comprising a list of gates from a synthesis library.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A reference voltage generator comprising:
   a resistor ladder comprising a plurality of resistive elements, each separated by a tap, wherein the resistor ladder is configured to generate a first reference voltage from a first tap within the resistor ladder;
   a current controller coupled to the resistor ladder, wherein the current controller is configured to:
      inject current into a second tap of the resistor ladder, responsive to receiving an indication to generate a second reference voltage greater than the first reference voltage; and
      draw current from a third tap of the resistor ladder, responsive to receiving an indication to generate a third reference voltage less than the first reference voltage.

2. The reference voltage generator as recited in claim 1, wherein each of the second reference voltage and the third reference voltage is generated from the first tap.

3. The reference voltage generator as recited in claim 1, further comprising a high threshold generator and a low threshold generator, each configured to generate a respective one of a logic high reference voltage and a logic low reference voltage by selecting a respective tap in the resistor ladder based on an indication of a respective one of a logic high offset and a logic low offset.

4. The reference voltage generator as recited in claim 3, wherein each of the high threshold generator and the low threshold generator comprises a plurality of pass gates, each configured to:
   receive the respective one of the logic high threshold offset or the logic low threshold offset from calibration circuitry; and
   connect the respective tap in the resistor ladder to an output of the reference voltage generator.

5. The reference voltage generator as recited in claim 1, wherein each of the first tap, the second tap and the third tap is a separate tap from one another in the resistor ladder.

6. The reference voltage generator as recited in claim 1, further comprising a transistor between a power supply and the resistor ladder, wherein a gate terminal of the transistor is configured to receive an enable signal for the reference voltage generator.

7. The reference voltage generator as recited in claim 1, wherein a current value of the reference voltage is generated for a number of pins at a receiver, wherein the number is less than eight.

8. The reference voltage generator as recited in claim 7, wherein the number of pins is one such that the current value of the reference voltage is generated for a single pin at the receiver.

9. The reference voltage generator as recited in claim 1, wherein the current controller is a current digital to analog converter coupled to a current mirror.

10. A method comprising:
    generating a first reference voltage from a first tap within a resistor ladder comprising a plurality of resistive elements each separated by a tap;
    injecting current into a second tap of the resistor ladder, responsive to receiving an indication to generate a second reference voltage greater than the first reference voltage; and
    drawing current from a third tap of the resistor ladder, responsive to receiving an indication to generate a third reference voltage less than the first reference voltage.

11. The method as recited in claim 10, wherein each of the second reference voltage and the third reference voltage is generated from the first tap.

12. The method as recited in claim 10, further comprising generating both a high threshold voltage and a low threshold voltage different than the high threshold voltage by selecting a respective tap in the resistor ladder based on an indication of a respective one of a logic high offset and a logic low offset.

13. The method as recited in claim 12, further comprising:
    receiving the respective one of the logic high threshold offset or the logic low threshold offset from calibration circuitry on an input of a pass gate; and
    connecting the respective tap in the resistor ladder to an output of the reference voltage generator through the pass gate.

14. The method as recited in claim 10, wherein each of the first tap, the second tap and the third tap is a separate tap from one another in the resistor ladder.

15. The method as recited in claim 10, further comprising generating a current value of the reference voltage for a single pin at a receiver.

16. A memory interface comprising:
    a first interface to a memory;
    a second interface to one or more processors configured to generate access requests for data stored in the memory;
    one or more reference voltage generators, each configured to:
       generate a first reference voltage from a first tap within a respective resistor ladder comprising a plurality of resistive elements, each separated by a tap;
       inject current into a second tap of the resistor ladder, responsive to receiving an indication to generate a second reference voltage greater than the first reference voltage; and
       draw current from a third tap of the resistor ladder, responsive to receiving an indication to generate a third reference voltage less than the first reference voltage.

17. The memory interface as recited in claim 16, wherein each of the second reference voltage and the third reference voltage is generated from the first tap.

18. The memory interface as recited in claim 16, wherein the reference voltage generator is further configured to generate both a high threshold voltage and a low threshold voltage different than the high threshold voltage by selecting a respective tap in the resistor ladder based on an indication of a respective one of a logic high offset and a logic low offset.

19. The memory interface as recited in claim 18, wherein the reference voltage generator is further configured to:
   receive the respective one of the logic high threshold offset or the logic low threshold offset from calibration circuitry on an input of a pass gate; and
   connect the respective tap in the resistor ladder to an output of the reference voltage generator through the pass gate.

20. The memory interface as recited in claim 16, wherein the reference voltage generator is further configured to generate a current value of the reference voltage for a single pin at a receiver.

* * * * *